(12) United States Patent
Mori et al.

(10) Patent No.: US 10,139,430 B2
(45) Date of Patent: Nov. 27, 2018

(54) PROBE GUIDE, PROBE CARD, AND METHOD FOR PROBE GUIDE MANUFACTURING

(71) Applicants: Japan Electronic Materials Corporation, Hyogo (JP); Shinko Electric Industries Co., Ltd., Nagano (JP)

(72) Inventors: Chikaomi Mori, Hyogo (JP); Yuichiro Shimizu, Nagano (JP); Kosuke Fujihara, Nagano (JP)

(73) Assignees: SHINKO ELECTRIC INDUSTRIES CO., LTD., Nagano (JP); JAPAN ELECTRONIC MATERIALS CORPORATION, Hyogo (JP)

( * ) Notice: Subject to any disclaimer, the term of this patent is extended or adjusted under 35 U.S.C. 154(b) by 0 days.

(21) Appl. No.: 15/420,111

(22) Filed: Jan. 31, 2017

(65) Prior Publication Data

US 2017/0242057 A1   Aug. 24, 2017

(30) Foreign Application Priority Data

Feb. 23, 2016   (JP) ................. 2016-031622

(51) Int. Cl.
G01R 31/28 (2006.01)
G01R 1/073 (2006.01)
G01R 3/00 (2006.01)

(52) U.S. Cl.
CPC ..... G01R 1/07371 (2013.01); G01R 1/07342 (2013.01); G01R 1/07357 (2013.01); G01R 31/2886 (2013.01); G01R 3/00 (2013.01)

(58) Field of Classification Search
CPC ............ G01R 1/06711; G01R 1/06738; G01R 1/06744; G01R 1/0675; G01R 1/06755;
(Continued)

(56) References Cited

U.S. PATENT DOCUMENTS 6,033,935 A * 3/2000 Dozier, II ............. B23K 3/087
257/E23.004
7,884,014 B2 * 2/2011 Jang .................. H01L 21/76804
257/E21.578
(Continued)

FOREIGN PATENT DOCUMENTS

| JP | 2014-174145 A | 9/2014 |
| JP | 2014-181910 A | 9/2014 |
| JP | 2014-232030 A | 12/2014 |

Primary Examiner — Jermele M Hollington
Assistant Examiner — Steven Yeninas
(74) Attorney, Agent, or Firm — Kilyk & Bowersox, P.L.L.C.

(57) ABSTRACT

OBJECT
To improve the strength of a probe guide and improve the abrasion resistance of the probe guide.
MEANS FOR SETTLEMENT
A guide plate 20 is formed of a silicon plate 22 having guide holes 23 respectively adapted to support contact probes 13, the inner walls of the guide holes 23 include a guide film 25 formed on the inner wall surfaces of corresponding penetration-processed holes 24 of the silicon plate 22, the cross-sectional areas of the penetration-processed holes 24 gradually increase toward a first surface of the silicon plate 22, and the film thickness of the guide film 25 gradually increases toward the first surface of the silicon plate 22. By employing such a configuration, as compared with the tilts of the inner wall surfaces of the penetration-processed holes 24, the tilts of the inner wall surfaces of the guide holes 23 can be suppressed, and the strength of the silicon plate 20 can be improved. Accordingly, the abrasion resistance of a probe guide 100 can be improved.

7 Claims, 6 Drawing Sheets

(58) Field of Classification Search
CPC .......... G01R 1/07314; G01R 1/07342; G01R
1/07371; G01R 3/00; G01R 31/2886;
G01R 31/2887; G01R 31/2889; G01R
1/0408; G01R 1/07357; G01R 1/07364
USPC .......... 324/750.25, 754.01, 754.03, 754.14,
324/755.01–755.06, 755.11, 756.03,
324/762.02–762.06; 439/482; 438/639,
438/640, 694, 696
See application file for complete search history.

(56) References Cited

U.S. PATENT DOCUMENTS

| | | | |
|---|---|---|---|
| 8,062,970 B2* | 11/2011 | Tanaka | H01L 21/2855 257/E29.119 |
| 2008/0293263 A1* | 11/2008 | Murata | G01R 1/06716 439/66 |
| 2014/0266274 A1 | 9/2014 | Shiraishi et al. | |
| 2014/0266275 A1 | 9/2014 | Kimura et al. | |
| 2014/0354315 A1 | 12/2014 | Shimizu et al. | |

* cited by examiner (a)

(b)

PROBE GUIDE, PROBE CARD, AND METHOD FOR PROBE GUIDE MANUFACTURING

TECHNICAL FIELD

The present invention relates to a probe guide, a probe card, and a method for probe guide manufacturing, and more specifically, to improving a guide hole of a probe guide.

BACKGROUND ART

In general, a probe card is configured to provide a number of contact probes to stand on a wiring board, and used in an inspection process of semiconductor integrated circuits. A semiconductor integrated circuit is inspected by bringing contact probes into contact with corresponding electrode pads of the semiconductor integrated circuit formed on a semiconductor wafer and electrically connecting the semiconductor integrated circuit and an external device to each other. When doing this, in order to accommodate variations in the heights of contact probes and electrode pads and thereby surely electrically connect the contact probes and the electrode pads, a process to press the contact probes against the electrode pads is performed, correspondingly. This process is called overdrive.

It is known that some type of conventional probe cards include a probe guide adapted to support contact probes. A probe guide is formed with a number of guide holes, and the contact probes are inserted into corresponding guide holes and supported movably in a direction of the insertion. By providing such a probe guide, the tips of the contact probes can be accurately positioned.

The conventional probe guide is made of a ceramic plate, and the guide holes are typically formed by drilling or laser machining. However, in recent years, as the degree of integration of a semiconductor integrated circuit has been increased, it has been demanded to decrease the diameter of guide holes and the pitch between adjacent guide holes, and as a result, the formation of the guide holes by drilling or laser machining is becoming difficult. For this reason, it is proposed that guide holes are formed in a silicon plate by etching to fabricate a probe guide; however, the problem of being difficult to ensure the strength of the probe guide exists.

Each of the guide hole formed by the etching is such that the inner wall surface thereof is tapered, and thereby opening diameters at both ends are made unequal. As a result, the thickness of a partition wall separating adjacent guide holes changes in a thickness direction of the guide plate, and is thinner on a large diameter side than on a small diameter side. That is, the thickness of the partition wall that is thinned due to the decrease in the pitch is further thinned by the tapered guide holes, and consequently the strength of the probe guide is reduced. In particular, since silicon that is easy to etch is brittle as compared with ceramic, ensuring the strength is difficult. In addition, when the inner wall surfaces of the guide holes are worn by sliding friction with corresponding contact probes at the time of inspection, the partition walls are more likely to be broken, and therefore the problem of being difficult to ensure the abrasion resistance of the probe guide exists.

CITATION LIST

Patent Literature

Patent Literature 1: Japanese Unexamined Patent Publication JP-A 2014-181910

SUMMARY OF INVENTION

Problem to be Solved

The present invention is made in consideration of the above-described situations, and intends to improve the strength of a probe guide. Also, the present invention intends to improve the abrasion resistance of the probe guide. Further, the present invention intends to provide a probe card including such a probe guide.

In particular, the present invention intends to improve the strength of a probe guide formed of a silicon plate having etched guide holes. Also, the present invention intends to improve the abrasion resistance of such a probe guide. Further, the present invention intends to provide a probe card including such a probe guide.

Means of Solving the Problems

A probe guide according to a first aspect of the present invention is configured to include a silicon plate having a guide hole adapted to support a contact probe, in which: the inner wall of the guide hole includes a guide film formed on the inner wall surface of a penetration-processed hole of the silicon plate; the cross-sectional area of the penetration-processed hole gradually increases toward a first surface of the silicon plate; and the film thickness of the guide film gradually increases toward the first surface of the silicon plate.

By employing such a configuration, as compared with the tilt of the inner wall surface of the penetration-processed hole, the tilt of the inner wall surface of the guide hole can be suppressed, and the strength of the silicon plate can be improved. Accordingly, the abrasion resistance of the probe guide can be improved.

A probe guide according to a second aspect of the present invention is, in addition to the above configuration, configured such that the guide film is formed as a sputtered film. By employing such a configuration, the guide film can be easily formed.

A probe guide according to a third aspect of the present invention is, in addition to the above configuration, configured such that the penetration-processed hole is formed as an etched hole. By employing such a configuration, the guide hole can be easily made fine or the pitch between adjacent guide holes can be easily narrowed.

A probe guide according to a fourth aspect of the present invention is, in addition to the above configuration, configured such that the guide film is made of diamond-like carbon or yttria stabilized zirconia.

A probe guide according to a fifth aspect of the present invention is, in addition to the above configuration, configured such that on the inner wall surface of the penetration-processed hole of the silicon plate, a silicon oxide film is formed.

A probe card according to a sixth aspect of the present invention is configured to include a wiring board, a contact probe provided to stand on the wiring board, and a probe guide adapted to support the contact probe, in which: the contact probe is configured to include a probe base part electrically connected with the wiring board, a probe tip part adapted to contact with an inspection target, and an elastic deformation part which is provided between the probe base part and the probe tip part and is capable of buckling deformation; said probe guide includes a silicon plate having a guide hole adapted to support the probe base part or the probe tip part of the contact probe; the inner wall of the guide hole includes a guide film formed on the inner wall surface of a penetration-processed hole of the silicon plate; the cross-sectional area of the penetration-processed hole gradually increases toward a first surface of the silicon plate; and the film thickness of the guide film gradually increases toward the first surface of the silicon plate.

A method for probe guide manufacturing according to a seventh aspect of the present invention includes: a step of forming in a silicon plate a penetration-processed hole of which the cross-sectional area gradually increases toward a first surface of the silicon plate; and a step of forming a guide film of which the film thickness gradually increases toward the first surface of said silicon plate.

A method for probe guide manufacturing according to an eighth aspect of the present invention is, in addition to the above configuration, configured such that the guide film is formed by sputtering with a target arranged on the first surface side of the silicon plate.

Advantageous Effects of Invention

According to the present invention, the strength of the probe guide can be improved. Also, the abrasion resistance of the probe guide can be improved. Further, the probe card including such a probe guide can be provided.

In particular, the strength of the probe guide formed of the silicon plate having the etched guide hole can be improved. Also, the abrasion resistance of such a probe guide can be improved. Further, the probe card including such a probe guide can be provided.

DESCRIPTION OF EMBODIMENTS

Figure 1:
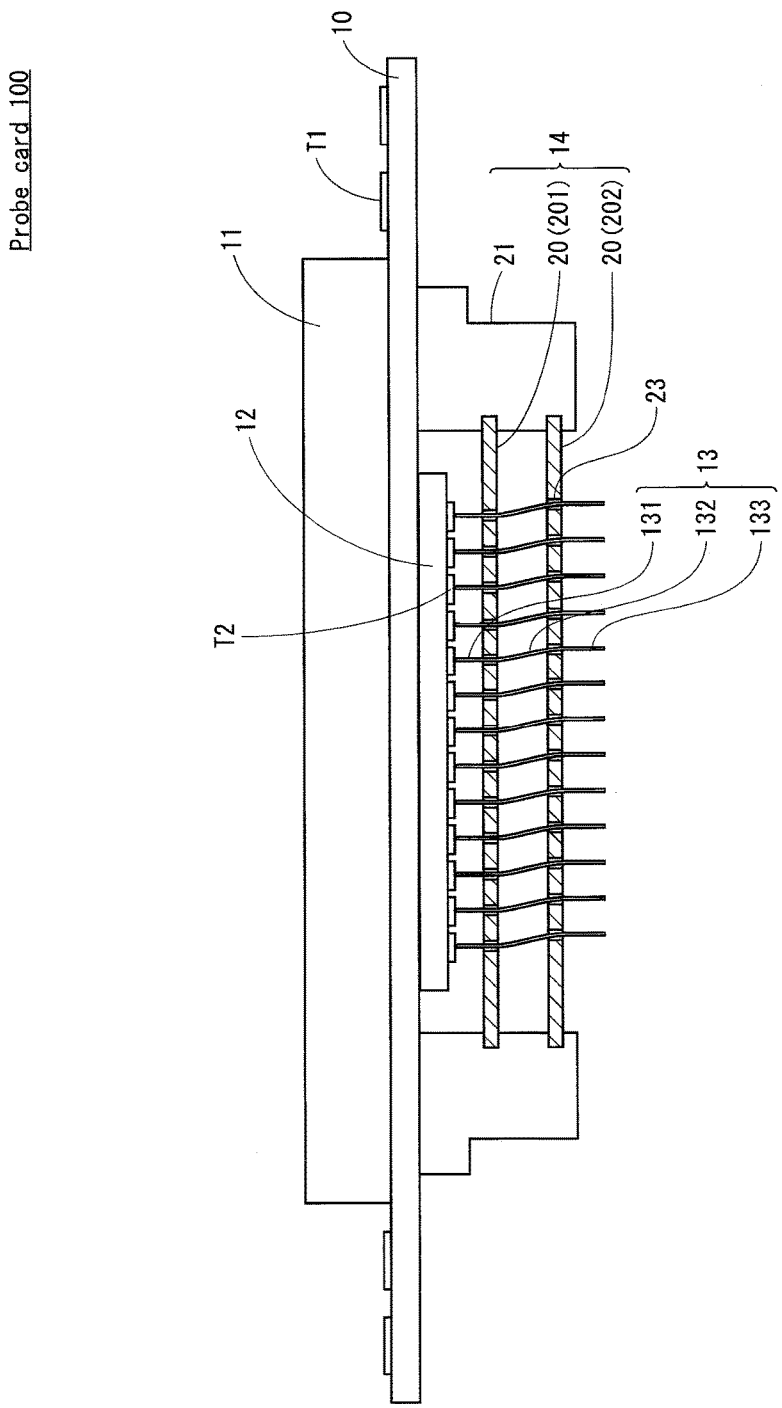
FIG. 1 is a cross-sectional view illustrating a configuration example of a probe card 100 according to an embodiment of the present invention.
Figure 2:
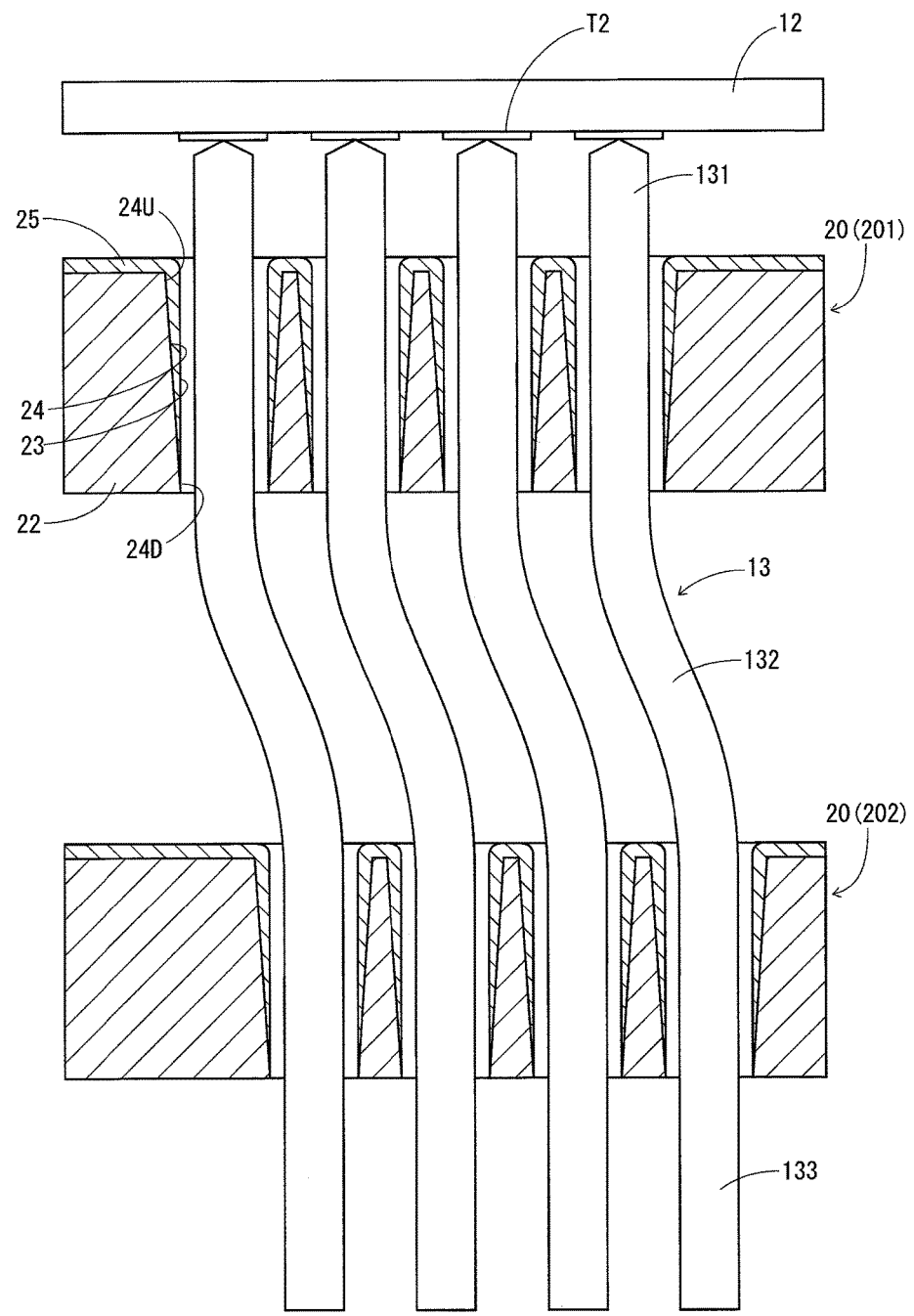
FIG. 2 is a partially enlarged view illustrating the configuration example of the probe card 100 according to the embodiment of the present invention.

FIGS. 1 and 2 are diagrams illustrating a configuration example of a probe card 100 according to an embodiment of the present invention.

FIG. 1 illustrates a cross section when the probe card 100 arranged in the horizontal direction such that the contact probe 13 is on the lower side is cut along a vertical plane.

FIG. 2 illustrates the detailed configuration of the contact probes 13 and the guide plates 20.

The probe card 100 is a device used in an inspection process of semiconductor integrated circuits, and configured to include a main board 10, a reinforcing plate 11, an ST (space transformer) board 12, the contact probes 13, and a probe guide 14.

The main board 10 is a wiring board adapted to be detachably attached to a prober (not illustrated), for example, a disk-shaped printed circuit board, and provided with a number of external electrodes T1. The external electrodes T1 are input/output terminals for inputting/outputting signals to/from a tester, and arranged in the peripheral part of the main board 10.

The reinforcing plate 11 is a reinforcing member for preventing the deformation of the main board 10, made of a material having higher rigidity than the main board 10, and attached on the upper surface of the main board 10. For example, a flat plate-shaped metallic block made of stainless steel can be used as the reinforcing plate 11.

The ST board 12 is a wiring board for converting a wiring pitch, and attached on the lower surface of the main board 10 parallel to the main board 10. Also, the ST board 12 is arranged on the inner side than the external electrodes T1 of the main board 10. In addition, on the lower surface of the ST board 12, a number of probe electrodes T2 corresponding to the contact probes 13 are formed, and each of the probe electrodes T2 is electrically connected to a corresponding one of the external electrodes T1. That is, the probe electrodes T2 have a narrower pitch than the external electrodes T1, and by interposing the ST board 12, the contact probes 13 can be disposed at narrow pitches. Note that when omitting the ST board 12, the probe electrodes T2 are formed on the lower surface of the main board 10.

The contact probes 13 are probes adapted to contact with microelectrodes on an inspection target, and vertical type probes that have a substantially linear shape and are substantially vertically provided to stand on the ST board 12. The respective contact probes 13 are orderly arranged corresponding to electrode pads of a semiconductor integrated circuit as the inspection target.

The probe guide 14 is a supporting member for the contact probes 13, which guides the contact probes 13 for positioning in a plane parallel to the main board 10. The probe guide 14 is configured to include: the one or more guide plates 20 adapted to support the contact probes 13; and a guide plate attachment part 21 adapted to fix the guide plates 20. The guide plates 20 are arranged by the guide plate attachment par 21 so as to be parallel to the main board 10 in positions separated from the main board 10 and the ST board 12.

Each of the guide plates 20 is formed of a flat plate-shaped silicon plate 22 formed with a number of guide holes 23. The silicon plate 22 is made of single-crystalline silicon, polycrystalline silicon, or amorphous silicon, and has an arbitrary outer shape such as a circular shape or a rectangular shape. The guide holes 23 are through-holes formed in a thickness direction of the silicon plate 22, i.e., in the vertical direction. Also, on the upper surface of the silicon plate 22 and on the inner wall surfaces of the guide holes 23, a guide film 25 is formed.

The guide holes 23 are the through-holes of the guide plate 20 for inserting the contact probes 13, respectively and correspondingly. Each of the guide holes 23 is such that the cross section thereof has a size and shape corresponding to a contact probe 13, and supports the contact probe 13 movably in a direction of the insertion. Also, the inner wall surface of the guide hole 23 includes the guide film 25 formed on the inner wall surface of a penetration-processed hole 24 of the silicon plate 22.

The penetration-processed hole 24 is a through-hole of the silicon plate 22 formed by etching. The penetration-processed hole 24 has a tapered shape extending in the vertical direction, and the inner wall surface thereof has an angle with respect to the vertical direction. For this reason, the penetration-processed hole 24 is such that openings at both ends thereof are different in size and the cross-sectional area thereof gradually increases from a smaller one of the openings toward the other larger opening.

The guide film 25 is a tilt suppressing film for suppressing the tilt of the inner wall surface of the penetration-processed hole 24. The film thickness of the guide film 25 in the penetration-processed hole 24 gradually increases from the one opening toward the other opening. That is, the cross-sectional area of the penetration-processed hole 24 and the film thickness of the guide film 25 coincide with each other in terms of a direction of the gradual increase. By forming such a guide film 25, the tilt angle of the inner wall surface of the guide hole 23 can be suppressed as compared with the tilt angle of the inner wall surface of the penetration-processed hole 24. As a result, the wall thickness between the guide hole 23 and an adjacent guide hole 23 near the other opening (larger opening) can be increased to improve the strength of the guide plate 20.

The guide plate 20 illustrated is such that the upper opening 24U of the penetration-processed hole 24 formed in the upper surface is larger than the lower opening 24D, and the cross-sectional area of the penetration-processed hole 24 gradually increases from the lower opening 24D toward the upper opening 24U. The film thickness of the guide film 25 also gradually increases from the lower opening 24D toward the upper opening 24U, and the top-bottom direction of the inner wall surface of the guide hole 23 is substantially coincident with the vertical direction.

Also, the probe guide 14 illustrated includes the two guide plates 20, i.e., the upper guide plate 201 and the lower guide plate 202. The upper guide plate 201 supports the probe base parts 131 of the contact probes 13, and the lower guide plate 202 supports the probe tip parts 133 of the contact probes 13. In addition, between the upper guide plate 201 and the lower guide plate 202, elastic deformation parts 132 of the contact probes 13 are arranged.

Mutually corresponding guide holes 23 of the upper and lower guide plates 201 and 202 are arranged with positions in planes made different, respectively, and thereby the elastic deformation parts 132 of the contact probes 13 form a gently curved shape. For this reason, at the time of inspection, an overdrive process bucklingly deforms the elastic deformation parts 132, and thereby all the contact probes 13 can be surely electrically connected to corresponding ones of the microelectrodes of the inspection target.

Figure 3:
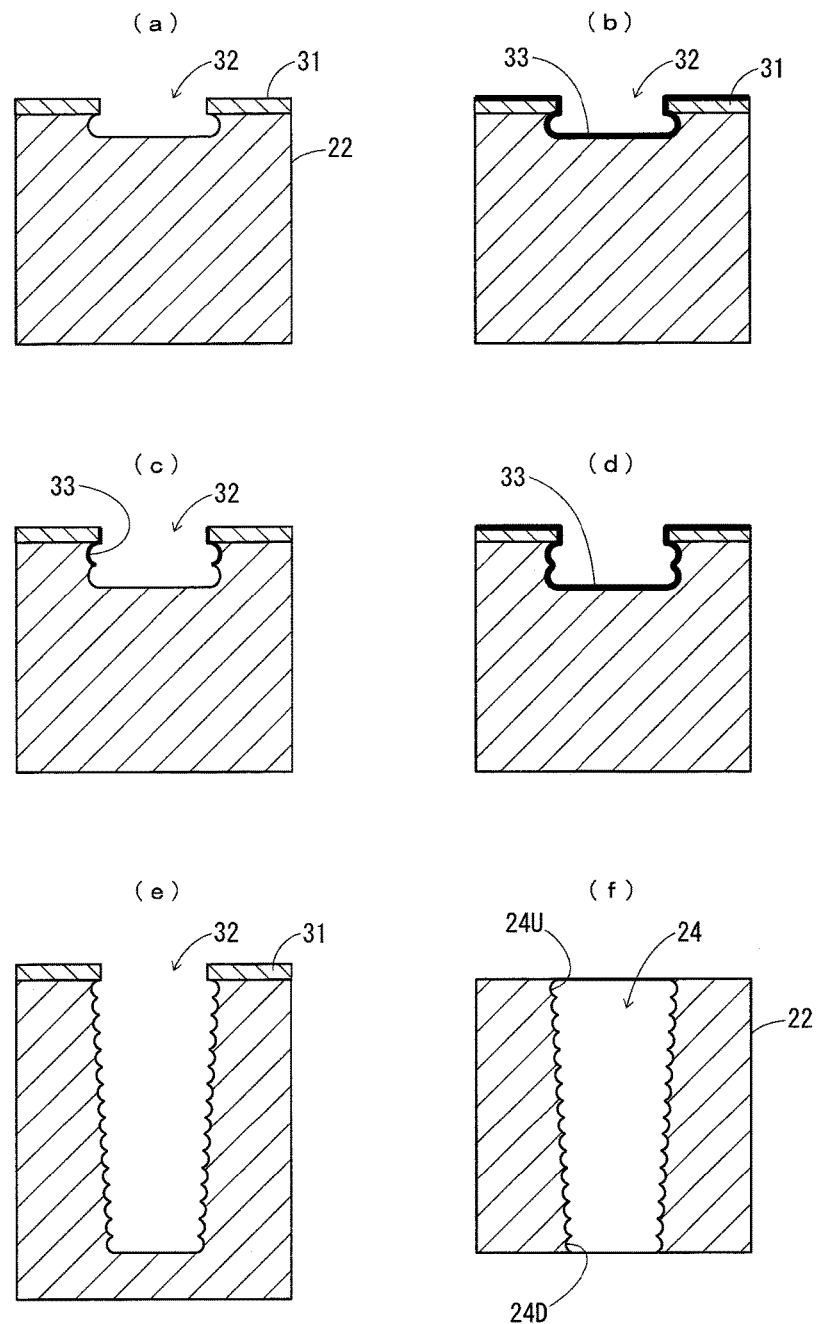
FIG. 3 is a diagram illustrating an example of a method for manufacturing a guide plate 20 according to the embodiment of the present invention, in which etching steps are illustrated.
Figure 4:
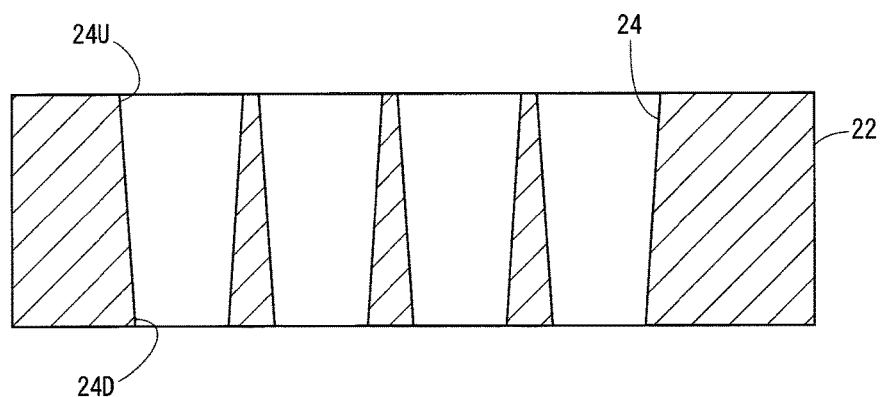
FIG. 4 is a diagram illustrating the method for manufacturing the guide plate 20 according to the embodiment of the present invention, in which sputtering steps are illustrated.
Figure 4:
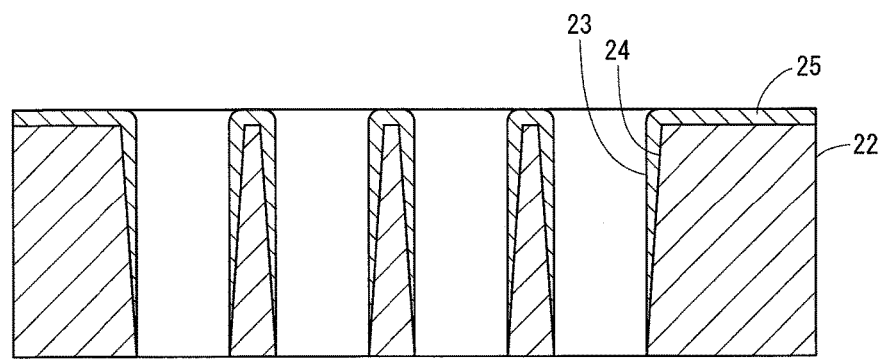

FIGS. 3 and 4 are diagrams illustrating an example of a method for manufacturing the guide plates 20 illustrated in FIG. 1. FIGS. 3(a) to (f) illustrate the steps of forming the penetration-processed hole 24 in the silicon plate 22.

The penetration-processed hole 24 is formed by etching the silicon plate 22. In the present embodiment, an example of using DRIE (a deep reactive ion etching method) will be described. The DRIE is a method adapted to alternately perform RIE (reactive ion etching) and protective film formation, and as compared with typical RIE, a concave part of which the side wall surface has a small tilt with respect to the thickness direction of the silicon plate 22 can be formed.

FIG. 3(a) illustrates a state after a first etching step. On the upper surface of the silicon plate 22, a patterned resist film 31 is formed, and in an opening area of the resist film 31, the silicon plate 22 is shallowly etched to form a concave part 32. The resist film 31 is applied on the entire upper surface of the silicon plate 22, then exposed and developed using a patterned mask to expose the silicon plate 22 in the area corresponding to the penetration-processed hole 24. After that, by performing etching for an extremely short period of time using, for example, $SF_6$ gas, the shallow concave part 32 is formed.

FIG. 3(b) illustrates a state after a first protective film formation step. The protective film formation is performed after the first etching step. A protective film 33 is, for example, a polymerized film of $C_xF_y$, formed using $C_4F_8$ gas, and formed on the upper surface of the resist film 31 and on the bottom surface and side wall surface of the concave part 32.

FIG. 3(c) illustrates a state after a second etching step. After the first formation of the protective film 33, etching using $SF_6$ gas is again performed. This etching removes the protective film 33 on the bottom surface of the concave part faster than that on the side wall surface. For this reason, in a state where the protective film 33 remains on the side wall surface, only etching in a depth direction is performed, and thereby the concave part 32 deeper than before is formed.

FIG. 3(d) illustrates a state after a second protective film formation step. After the second etching step, the protective film 33 is again formed in the same manner as that in the case of (b).

FIG. 3(e) illustrates a state where the concave part 32 having sufficient depth is subsequently formed by repeating etching and protective film formation in the same manner as above.

FIG. 3(f) illustrates a state where the penetration-processed hole 24 is formed. The penetration-processed hole 24 is formed by removing the resist film 31 from the state of FIG. 3(e), and polishing a second surface (lower surface) of the silicon plate 22 to open the concave part 32 on the side of the second surface.

Using the DRIE enables the formation of the penetration-processed hole 24 of which the side wall surface has a relatively small tilt with respect to the vertical direction. However, it is difficult to make the top-bottom direction of the side wall surface completely coincident with the vertical direction, and the cross-sectional area of the penetration-processed hole 24 is brought into a state of gradually decreasing or increasing from the upper surface toward the lower surface. FIG. 3 illustrates an example where the cross-sectional area gradually decreases toward the lower surface; however, the gradual increase or decrease is determined depending on the conditions for etching and protective film formation.

FIGS. 4(a) and (b) illustrate steps of forming the guide film 25. FIG. 4(a) illustrates a state where the penetration-processed holes 24 are formed by DRIE. FIG. 4(b) illustrates a state where sputtering is performed from above the silicon plate 22, and on the upper surface of the silicon plate 22 and on the inner wall surfaces of the penetration-processed holes 24, the guide film 25 is formed.

The guide film 25 is a sputtered film formed by sputtering onto a first surface of the silicon plate 22, and formed on the surface of the silicon plate 22 on the side of the sputtering and on the inner wall surfaces of the penetration-processed holes 24. For example, the sputtering is performed in a state where a target is arranged on the side of the first surface of the silicon plate 22 and the second surface of the silicon plate 22 is in close contact with a stage. When doing this, on the first surface of the silicon plate 22 (on the sputtering side), the guide film 25 is formed, whereas on the second surface of the silicon plate 22 (on the side opposite to the sputtering side), the guide film 25 is not formed. Also, the film thickness of the guide film 25 formed in the penetration-processed holes 24 decreases with distance from the openings on the sputtering side. That is, the guide film 25 in the penetration-processed holes 24 is formed such that the film thickness thereof gradually increases toward the first surface.

In FIG. 4(b), the sputtering is performed onto the surface of the silicon plate 22 where the penetration-processed holes 24 having a larger opening are formed. That is, the cross-sectional areas of the penetration-processed holes 24 also gradually increase toward the first surface. By making the direction to gradually increase the cross-sectional areas of the penetration-processed holes 24 and the direction to gradually increase the film thickness of the guide film 25 coincident with each other as described, the tilts of the inner wall surfaces of the guide holes 23 can be suppressed.

For the guide film 25, various materials can be used. Note that using a material having insulation properties and compatible with silicon, for example, diamond-like carbon (DLC) or yttria stabilized zirconia (YSZ), is particularly desirable.

Note that in order to prevent different contact probes 13 from being mutually electrically connected through the guide plate 20, the guide plate 20 is desirably formed with an insulating film, for example, a silicon oxide film ($SiO_2$). The insulating film is formed on the inner wall surfaces of the penetration-processed holes 24, for example, before the formation of the guide film 25.

Figure 5:
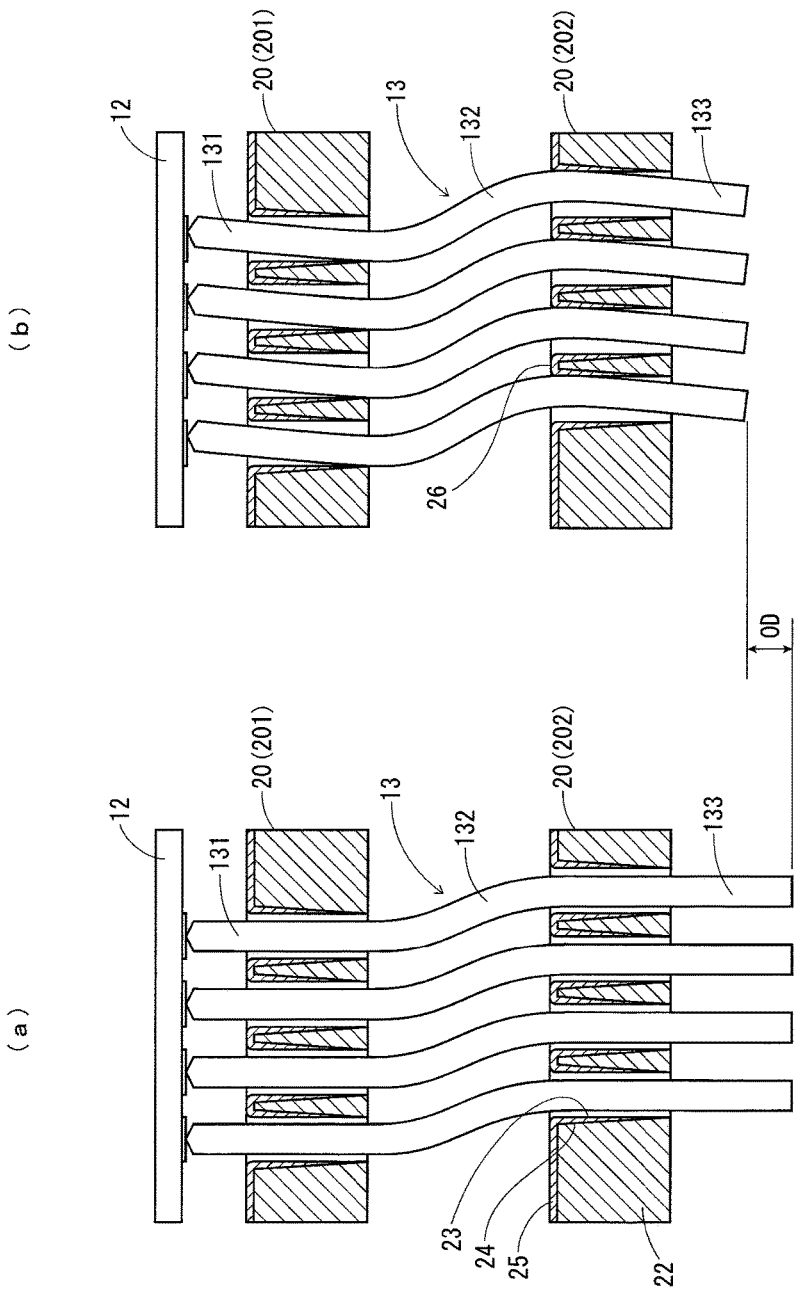
FIG. 5 is a diagram illustrating a state of the probe card 100 according to the embodiment of the present invention at the time of inspection.
Figure 6:
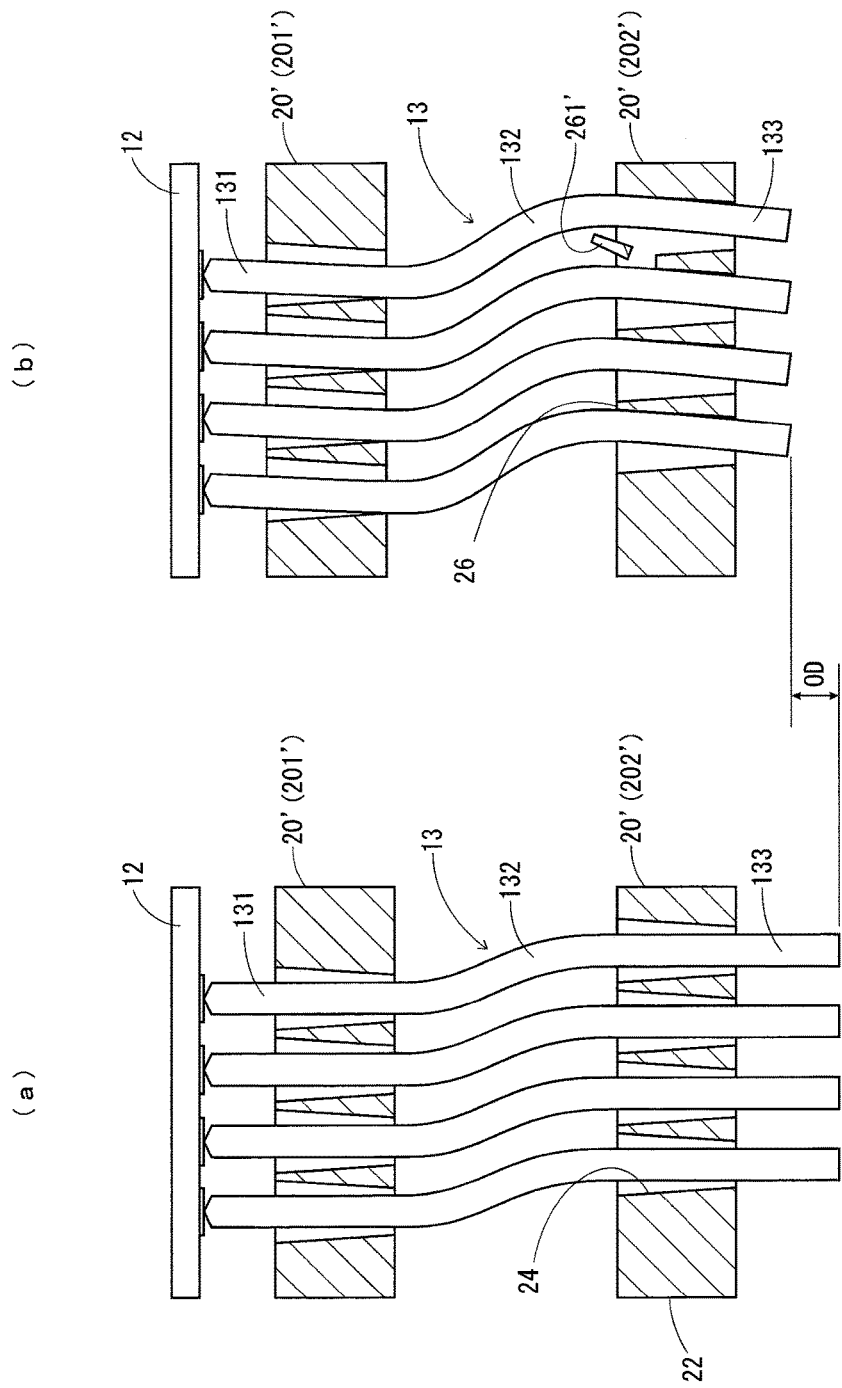
FIG. 6 is a diagram illustrating a state of a comparative example at the time of inspection.

FIGS. 5 and 6 are diagrams illustrating the state of the contact probes 13 and the guide plates 20 and 20' at the time of inspection. FIG. 5 illustrates the case of the guide plate 20 formed with the guide film 25, and as a comparative example, FIG. 6 illustrates the case of the guide plate 20' not formed with the guide film 25.

FIGS. 5(a) and 6(a) illustrate the states before inspection, i.e., the states before the inspection target (not illustrated) contacts with the contact probes 13. FIGS. 5(b) and 6(b) illustrate the states at the time of inspection when overdrive is performed. The overdrive is a process to elastically deform the contact probes 13 by, from a state where the inspection target is brought close to the probe card 100 to a position where the microelectrodes of the inspection target are supposed to contact with corresponding ones of the contact probes 13, further bringing the inspection target by a predetermined distance called an overdrive amount OD.

Each of the contact probes 13 during the inspection is, as compared with that before the inspection, such that the elastic deformation part 132 thereof is greatly bucklingly deformed and the probe base part 131 and probe tip part 133 thereof are slightly tilted. The tilt of the probe base part 131 and the probe tip part 133 stops as the contact probe 13 contacts the opening edge part of a corresponding guide hole 23, and the opening edge part is brought into a state of being strongly pressed by the contact probe 13. For this reason, when a partition wall 26 separating an adjacent guide hole 23 from the guide hole 23 is thin, the partition wall 26 may be broken during the inspection. In particular, when the inspection is repeatedly performed, and thereby the inner wall surface of the guide hole is worn to further thin the partition wall 26, the partition wall 26 is likely to be further broken, and consequently, the abrasion resistance of the guide plate 20 is reduced.

FIG. 6(b) illustrates a state where a thin part of the partition wall 26 is broken. Since each guide holes in FIG. 6 is a penetration-processed hole 24 not formed with the guide film 25, the partition wall 26 between adjacent guide holes on the side where larger openings are formed is thin, and therefore sufficient strength cannot be ensured. For this reason, during the inspection, the thin part of the partition wall 26 is broken.

On the other hand, as illustrated in FIG. 5(b), in the guide plate 20 formed with the guide film 25, the guide film 25 is formed to be thicker in parts where the partition walls 26 near the larger openings of the penetration-processed holes 24 are thin. For this reason, during the inspection, the partition wall 26 between any adjacent guide holes 23 can be suppressed from being broken.

Also, when the probe tip parts 133 of the contact probes 13 are excessively tilted, the positions of the tips of the contact probes 13 in a horizontal plane greatly change, and consequently there occurs a possibility that the contact probes 13 cannot contact with corresponding microelectrodes of the inspection object. Further, the horizontal displacement amounts of the elastically deformed elastic deformation parts 132 are increased, and thereby adjacent contact probes may also be likely to interfere with each other. For this reason, by forming the guide film 25 on the inner wall surfaces of the penetration-processed holes 24 to suppress the tilts of the inner wall surfaces, the occurrence of such problems can be suppressed.

The probe guide 14 according to the present embodiment includes the guide plates 20, i.e., the silicon plates 22 each in which the guide holes 23 adapted to support corresponding contact probes 13 are formed. The inner walls of the guide holes 23 are formed of the guide film 25 formed on the inner wall surfaces of the penetration-processed holes 24 of the silicon plate 22, correspondingly. The cross-sectional areas of the penetration-processed holes 24 gradually increase toward the first surface of the silicon plate 22 and the film thickness of the guide film 25 gradually increases toward the first surface of the silicon plate 22.

Even in the case where the cross-sectional areas of the penetration-processed holes 24 increase toward the first surface of the silicon plate 22, the film thickness of the guide film 25 also increases, and thereby the tilts of the inner walls of the guide holes 23 with respect to the vertical direction can be suppressed. As a result, the cross-sectional areas of the guide holes 23 on the first surface side of the silicon plate 22 can be suppressed from increasing more than necessary. In the case where the pitch between any adjacent guide holes 23 is the same, by decreasing the cross-sectional areas of the guide holes 23, the partition wall between the guide holes 23 is increased. For this reason, the strength of the guide plate 20 can be improved. In addition, abrasion resistance can also be improved.

Also, the guide film 25 in the present embodiment is formed as a sputtered film. Sputtering onto the first surfaces of the silicon plates 22 can easily form the guide film 25 of which the film thickness gradually increases toward the first surfaces of the silicon plates 22.

Further, the penetration-processed holes 24 are formed as etched holes. Forming the penetration-processed holes by etching makes it possible to obtain finer guide holes as compared with drilling or laser machining. However, although the etching makes the penetration-processed holes 24 tapered, the problem of the tilted inner wall surfaces of the penetration-processed holes 24 can be suppressed by forming the guide film 25 on the inner wall surfaces of the penetration-processed holes 24.

Still further, on the inner wall surfaces of the penetration-processed holes 23 of the silicon plates 22 in the present embodiment, the silicon oxide film is formed. Such a configuration makes it possible to surely prevent different contact probes from being electrically connected to each other.

Yet further, the probe card 100 according to the present embodiment includes: the ST board 12; the contact probes 13 provided to stand on the ST board 12; and the probe guide 14 adapted to support the contact probes 13. Also, the contact probes 13 include: the probe base parts 131 electrically connected to the ST board 12; the probe tip parts 133 adapted to contact with an inspection target; and the elastic deformation parts 132 which are provided between the probe base parts 131 and the probe tip parts 133 and are capable of buckling deformation, respectively and correspondingly. Further, the probe guide 14 is configured to include the silicon plates 22 each having the guide holes 23 adapted to support the probe base parts 131 or probe tip parts 133 of the contact probes 13, correspondingly. In addition, the inner walls of the guide holes 23 include the guide film 25 formed on the inner wall surfaces of the penetration-processed holes 24 of the silicon plates 22, correspondingly. Also, the cross-sectional areas of the penetration-processed holes 24 gradually increase toward the first surfaces of the silicon plates 22, correspondingly, and the film thickness of the guide film 25 gradually increases toward the first surfaces of the silicon plates 22.

In addition, a method for manufacturing the probe guide 14 according to the present embodiment includes: the step of, in each of the silicon plates 22, forming the penetration-processed holes 24 of which the cross-sectional areas gradually increase toward the first surface of that silicon plate 22; and the step of forming the guide film 25 of which the film thickness gradually increases toward the first surface of the silicon plate 22. Such a configuration makes it possible to improve the strength of the probe guide and improve abrasion resistance.

Further, the guide film 25 is formed by sputtering with the target arranged on the first surface side of the silicon plates 22. For this reason, the guide film 25 of which the film thickness gradually increases toward the first surfaces of the silicon plates 22 can be easily formed.

Note that in the present embodiment, a configuration example where the one probe guide 14 is attached on the main board 10 is described; however, two or more probe guides 14 can also be attached on one and the same main board 10.

Also, in the present embodiment, a configuration example where the probe guide 14 includes the two guide plates 20 is described; however, the probe guide 14 may be configured to include only one guide plate 20, or three or more guide plates 20. For example, the probe guide 14 may include only the lower guide plate 202, or the one upper guide plate 201 and two or more lower guide plates 202. Further, the present invention is desirably applied to all of two or more guide plates 20 constituting the probe guide 14, but can also be applied to only some of the guide plates 20.

In addition, in the present embodiment, an example of the probe card including the vertical type probes substantially vertically provided to stand on the ST board 12 is described; however, an object to be applied with the present invention is not limited to such a probe card. For example, the present invention can also be applied to a probe card including cantilever type probes or coil spring type probes.

Also, in the present embodiment, a configuration example where the guide film 25 is formed over the entire inner wall surfaces of the penetration-processed holes 24 is described; however, the guide film 25 may be partially formed on the inner wall surfaces of the penetration-processed holes 24. For example, the guide film 25 may be formed on only part of the inner wall surface of each of the penetration-processed holes 24 in the penetration direction. That is, in order to suppress the tilts of the inner wall surfaces of the penetration-processed holes 24 or increase the partition walls 26 on the opening 24U side, it is only necessary to change the thickness of the guide film 25 depending on a position in the penetration direction so as to increase the thickness on the upper opening 24U side and decrease the thickness on the lower opening 24D side, and the guide film 25 does not have to be formed on the entire inner wall surfaces.

Further, in the present embodiment, a configuration example where the first surfaces of the guide plates are arranged upward, and the cross-sectional areas of the penetration-processed holes 24 and the film thickness of the guide film 25 both gradually increase toward corresponding upper openings 24U is described; however, it may be configured to arrange the first surfaces of the guide plates downward and gradually increase both of the cross-sectional areas of the penetration-processed holes 24 and the film thickness of the guide film 25 toward corresponding lower openings 24D.

Still further, in the present embodiment, an example where the guide film is formed by sputtering is described; however, the guide film can also be formed by evaporation. For example, by performing evaporation with the second surfaces of the silicon plates 22 being in close contact with a stage, the guide film 25 can be formed on the first surfaces of the silicon plates 22 and on the inner wall surfaces of the penetration-processed holes 24. In this case, the film thickness of the guide film 25 in the penetration-processed holes 24 gradually increases toward the first surfaces of the silicon plates 22.

REFERENCE SIGNS LIST

100: Probe card
10: Main board
11: Reinforcing plate
12: ST board
13: Contact probe
131: Probe base part
132: Elastic deformation part
133: Probe tip part
14: Probe guide
20: Guide plate
201: Upper guide plate
202: Lower guide plate
21: Guide plate attachment part
22: Silicon plate
23: Guide hole
24: Penetration-processed hole
24D: Lower opening
24U: Upper opening
25: Guide film
26: Partition wall
261': Broken partition wall
31: Resist film
32: Concave part
33: Protective film
OD: Overdrive amount
T1: External electrode
T2: Probe electrode.

The invention claimed is:

1. A probe guide comprising
a silicon plate having a guide hole comprising a penetration-processed hole adapted to support a contact probe, wherein:
an inner wall of said guide hole includes a guide film formed on an inner wall surface of the penetration-processed hole of said silicon plate; a cross-sectional area of said penetration-processed hole gradually increases toward a first surface of said silicon plate; and a film thickness of said guide film gradually increases toward the first surface of said silicon plate.

2. The probe guide according to claim 1, wherein said guide film is a sputtered film.

3. The probe guide according to claim 1, wherein said penetration-processed hole is an etched hole.

4. The probe guide according to claim 1, wherein said guide film is made of diamond-like carbon or yttria stabilized zirconia.

5. The probe guide according to claim 1, wherein on the inner wall surface of the penetration-processed hole of said silicon plate, a silicon oxide film is formed.

6. The probe guide according to claim 1, wherein a first opening of the penetration-processed hole on the first surface of said silicon plate is larger than a second opening of the penetration-processed hole on a second surface opposite to the first surface.

7. A probe card comprising
a wiring board, a contact probe provided to stand on said wiring board, and a probe guide that supports said contact probe, wherein:
said contact probe is configured to include a probe base part electrically connected with said wiring board, a probe tip part adapted to contact with an inspection target, and an elastic deformation part which is provided between the probe base part and the probe tip part and is capable of buckling deformation;
said probe guide includes a silicon plate having a guide hole comprising a penetration-processed hole adapted to support said probe base part or said probe tip part of said contact probe;
an inner wall of said guide hole includes a guide film formed on an inner wall surface of the penetration-processed hole of said silicon plate;
a cross-sectional area of said penetration-processed hole gradually increases toward a first surface of said silicon plate; and
a film thickness of said guide film gradually increases toward the first surface of said silicon plate.

* * * * *